United States Patent [19]
Hobbs

[11] Patent Number: 5,091,881
[45] Date of Patent: Feb. 25, 1992

[54] MULTIPLE PORT MEMORY INCLUDING MERGED BIPOLAR TRANSISTORS

[75] Inventor: James B. Hobbs, Minneapolis, Minn.

[73] Assignee: Atmel Corporation, San Jose, Calif.

[21] Appl. No.: 365,664

[22] Filed: Jun. 13, 1989

[51] Int. Cl.[5] .................. G11C 11/411; G11C 11/414
[52] U.S. Cl. ..................................... 365/155; 365/156; 365/230.05; 365/225.6
[58] Field of Search ........... 365/155, 179, 156, 230.05, 365/189.04, 225.6, 190, 175

[56] References Cited

U.S. PATENT DOCUMENTS

| | | | |
|---|---|---|---|
| 4,125,877 | 11/1978 | Reinert | 365/190 |
| 4,623,990 | 11/1986 | Allen et al. | 365/230.05 |
| 4,628,489 | 12/1986 | Ong et al. | 365/225.6 |
| 4,754,430 | 6/1988 | Hobbs | 365/155 |
| 4,785,422 | 11/1988 | Berndt et al. | 365/225.6 |
| 4,815,038 | 3/1989 | Scharrer et al. | 365/230.05 |
| 4,817,051 | 3/1989 | Chang | 365/230.05 |
| 4,833,649 | 5/1989 | Greub | 365/230.05 |
| 4,833,651 | 5/1989 | Seltzer et al. | 365/230.05 |

OTHER PUBLICATIONS

"The Twin-Port Memory Cell", K. O'Connor, *IEEE Journal of Solid-State Circuits*, vol. SC-22, No. 5, 10/87, pp. 712-720.

Primary Examiner—Glenn Gossage
Attorney, Agent, or Firm—Schneck & McHugh

[57] ABSTRACT

A multiple port memory includes memory cells with merged PNP and NPN bipolar transistors. Each memory cell has a pair of PNP load transistors and a pair of NPN control transistors in a symmetric arrangement. One or more storage ports provides differential signals on two lines which can modify current flow in the memory cell. Similarly, one or more retrieval ports can be connected to two lines connected to the memory cell for reading current flow in the memory cell.

29 Claims, 5 Drawing Sheets

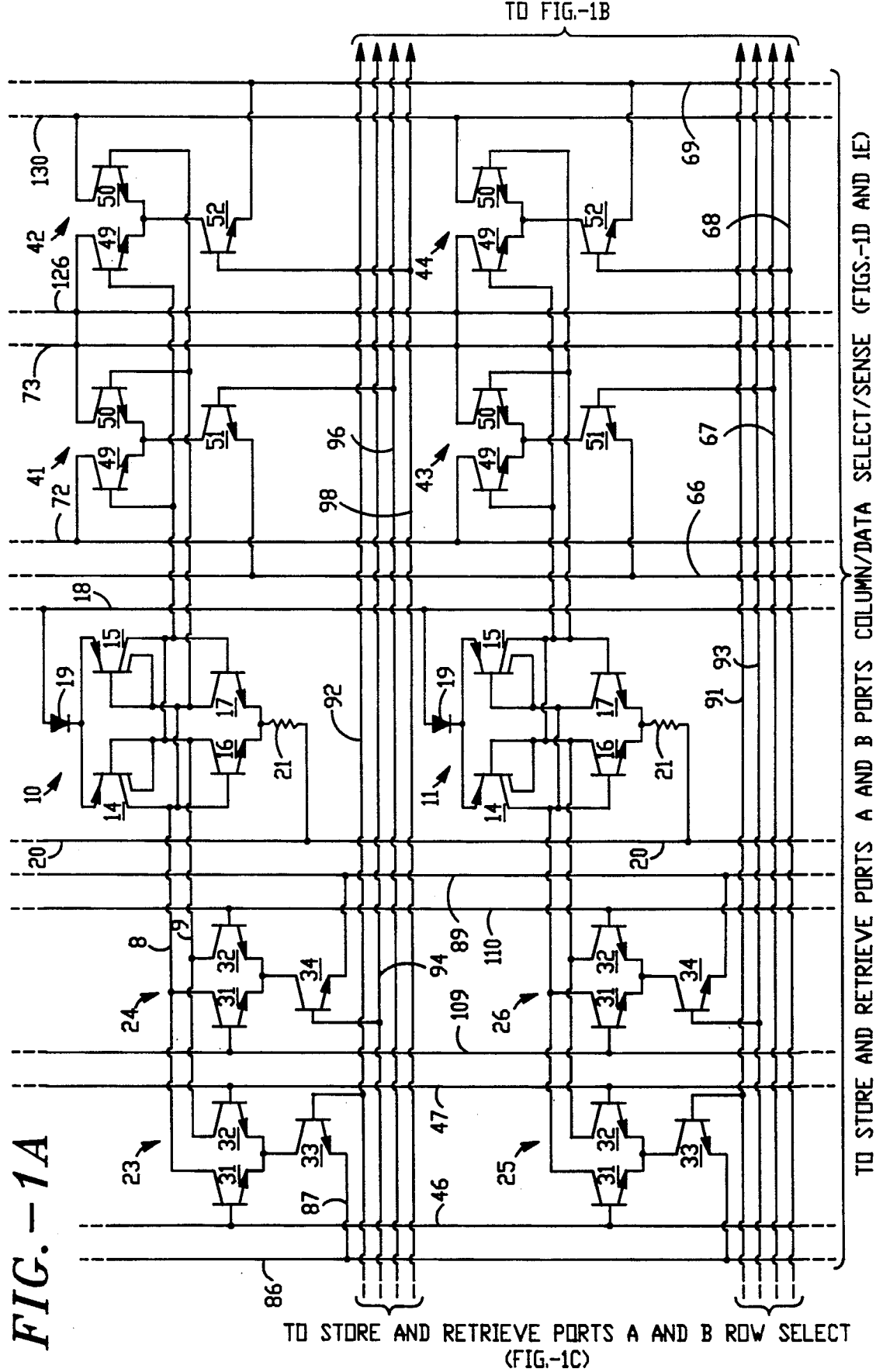

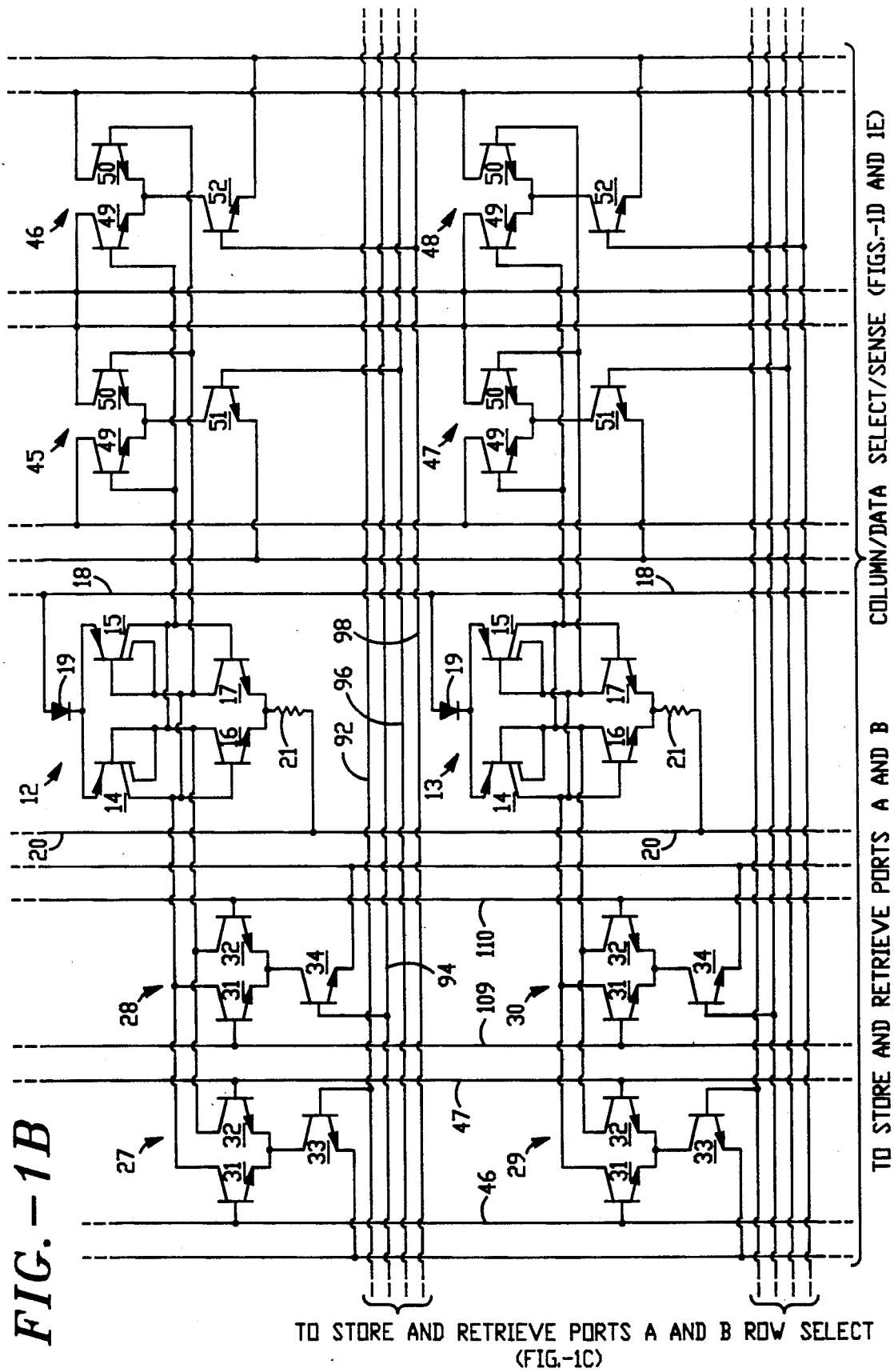

MULTIPLE PORT MEMORY INCLUDING MERGED BIPOLAR TRANSISTORS

BACKGROUND OF THE INVENTION

The present invention relates to memory systems for random access memories and, more particularly, to memory systems based on bipolar transistors.

Digital memories of various kinds are used extensively in computers and computer system components, digital processing systems, and the like. This increasing use has been made possible primarily by the rapid shrinking in size of monolithic integrated circuits that has been occurring in recent years. Such shrinkage has allowed an increase in the density of circuits provided in monolithic integrated circuit chips, and this has both improved performance and reduced cost.

Memory cell circuits based on bipolar transistors have been used primarily because of the speed of operation which can be obtained with such transistors. However, the advent of merged complementary bipolar transistor structures has permitted fabricating bipolar transistor memories also having a substantial density of memory cells in a monolithic integrated circuit chip.

A typical merged transistor circuit for a memory cell has a pair of PNP bipolar transistors serving as loads, and has a further pair of cross-coupled NPN bipolar transistors serving as the control transistors for operating the memory cell circuit. The emitters of the PNP bipolar transistors are connected to a memory system word line interconnection extending from the address decoding circuitry, and the emitters of the NPN bipolar transistors are connected to a corresponding memory system standby line interconnection also extending from the same decoding circuitry. Each control transistor has its collector connected to the other's base and to both the base of one PNP load transistor and to the collector of the other PNP load transistor.

In those situations in which the memory cell is not about to have information stored therein or to have information retrieved therefrom, the cell is in the standby mode of operation and relatively lower voltages are applied to both the word line and the standby line to which such a cell is connected. An increase in the voltages of these two interconnection lines occurs selectively, occurring in response to an appropriate address being presented to the memory indicating through the decoding circuitry the row of memory cells in which the cell of interest is located. This increase in voltage will permit storing or retrieving information from this memory cell.

The two bit lines associated with this cell are typically connected through a switching device of a suitable kind to the collectors, or to second emitters, of each control transistor. The arrangement is configured in the memory cell through these bit lines or retrieving information therefrom over these bit lines when there has been an increase in the voltage on the word line and the standby line to which the memory cell is connected as the basis for selecting that cell for such an operation.

In operation, one of the control NPN bipolar transistors is in the "on" condition, as is its corresponding PNP bipolar load transistor. Current thus flows through the memory cell bistable circuit side having these two devices by flowing in these devices, but not through the other side of the memory cell, to thereby set the state of that cell and so the information which it contains. The state of the cell is set by the combination of alternative voltage values occurring at the collectors of the control transistors or the alternative combinations of current flows through the sides of the memory cell.

Such a memory cell has a drawback, however, because the two transistors are in the "on" condition, and as a result, each is operated so as to be well into the saturation region thereof. This results in the storage of charge carriers in each of the base regions thereof, and so the switching time of such a pair of transistors from the "on" condition to the "off" condition is slowed. Such a slowing of the switching means that information cannot be stored in the memory cell as quickly as it might otherwise be, thus slowing the operation of the memory. Slowing the operation of the memory, in turn, slows the operation of the system in which the memory is used.

One improvement that can be made in such a memory cell is to have each of the PNP load transistors therein provided with a second collector connected to its base. This in effect provides current from both the base and the collector of that PNP load transistor which is in the "on" condition to the collector of the corresponding NPN control transistor rather than from just the base of such a PNP load transistor. This arrangement then reduces the base current required from that PNP load transistor, and correspondingly limits the saturation thereof. Such a PNP bipolar transistor then draws less base current therethrough. There is also less current flowing out of the other collector of the PNP transistor into the base of its control transistor to thereby reduce its saturation.

A further possibility is to provide a pair of supplemental NPN transistors having the emitters thereof connected to the collectors of the control transistors and the collectors thereof connected to the memory system word line. The bases of the supplemental transistors are connected to the bases of the control transistors. Such a supplemental transistor on the "on" condition side of the memory cell will provide a shunting of current around the PNP load transistor to supply the demand for current at the collector of the NPN control transistor. This will limit the current which needs to be provided through the base of the PNP load transistor to keep it from being driven far into saturation. This also will lead to supplying a smaller collector current from the PNP load transistor to the NPN control transistor to keep that transistor from being driven far into saturation, enabling both to switch into the "off" condition faster during a subsequent storing operation in the memory cell.

Even with these improvements in the memory cell design of the type using complementary load and control bipolar transistors, there are inherent system limitations which slow the operation of the memory system. Effectively selecting one row of memory cells by increasing the word line voltage and the standby interconnection line voltage involved with respect to similar interconnection lines for the other rows requires that the word line voltage be more than 1.0 volt above the voltage of the word lines of the other rows. This is to assure that the storing of information in a memory cell in that row does not affect the memory cells connected to the same bit lines in another row. Once such a word line is established at this higher voltage, the selection of another row requires discharging the capacitance of the word line in the previously selected row to decrease the relatively large voltage placed thereon for its selection.

This leads to substantial current in that row as its selection is being terminated.

Each row has a word line with a total effective capacitance comprising the distributed capacitance associated with the row word line itself, the standby line, and the junction capacitances associated with the electronic components in the cells. The discharge of such a capacitance in terminating the selection of a row, by changing the voltage on the row word line back to its standby value, should occur as rapidly as possible. This is because satisfactory memory operation forbids having more than one row of memory cells selected simultaneously beyond a transient switching period. Such simultaneous selection could occur by having a relatively high voltage on both the word line being newly selected and the one for which selection is being ceased. Such rapid discharges lead to relatively large memory cell currents which results in increasing the effect of diffusion capacitances in the cell thus further slowing the operation.

Supplying such large currents typically requires a substantial current supply capability for the word line decoding circuitry, and is usually further aided by the provision of a word line discharge circuit for each row. The word line structure to carry the large required currents adds capacitance to the word lines and, with such large signal changes thereon, tends to slow retrieval of information from the memory cell.

Also, storing information in such a memory cell requires changes in bit line voltages on the order of one-half volt (0.5 v) requiring further capacitive charges and discharges and slows operation. Providing for sufficient decoder current supply capability and the relatively large bit line voltage changes further requires providing a separate current source for each bit line rather than being able to switch bit lines between a single source.

In addition, digital systems using such memories have increasingly required memories which have the ability to store information in two different memory cells in each storage cycle, or to store information in one cell and retrieve it from another cell in a single cycle, or other similar combinations. Such dual port, or multiport, memories have often been implemented by lengthening the data storage time period or the data retrieval time period to permit two such operations to occur sequentially during such periods so that it appears that there have been two operations done in each memory operation cycle. Such lengthening of memory operation cycles, of course, slows the operation of the memory insofar as storing or retrieving from any one cell.

Thus, there is a desire to have a memory system which operates with reduced current flow through the memory cells therein to increase the rapidity of operation of that system. Further, there is a desire to have a memory system which permits multiple simultaneous storage and retrieval operations without reducing the rapidity of operation of the memory system with respect to any one such operation.

SUMMARY OF THE INVENTION

The present invention provides a memory cell having a storage port associated with it such that the control interconnections from the decoding circuitry for selecting the memory cell and the interconnections from the data buffer providing the information for storage need not be directly connected to the memory cell. Rather, control signals are applied to the port to store data in the cell. This arrangement is provided for a single storage port and for multiple storage ports, and also for a retrieval port or multiple retrieval ports. The control signals and data signals can be either differential signals or operated at levels characteristic of differential signals, and the memory cell can be operated at relatively low currents. These arrangements can be used with several kinds of memory cells with a typical memory cell being one having a pair of PNP bipolar transistors as loads for a pair of NPN cross-coupled control bipolar transistors.

BRIEF DESCRIPTION OF THE DRAWINGS

FIGS. 1A through 1E show a mixed block and circuit schematic of a memory system embodying the present invention;

DETAILED DESCRIPTION OF THE PREFERRED EMBODIMENTS

Figure 1C:
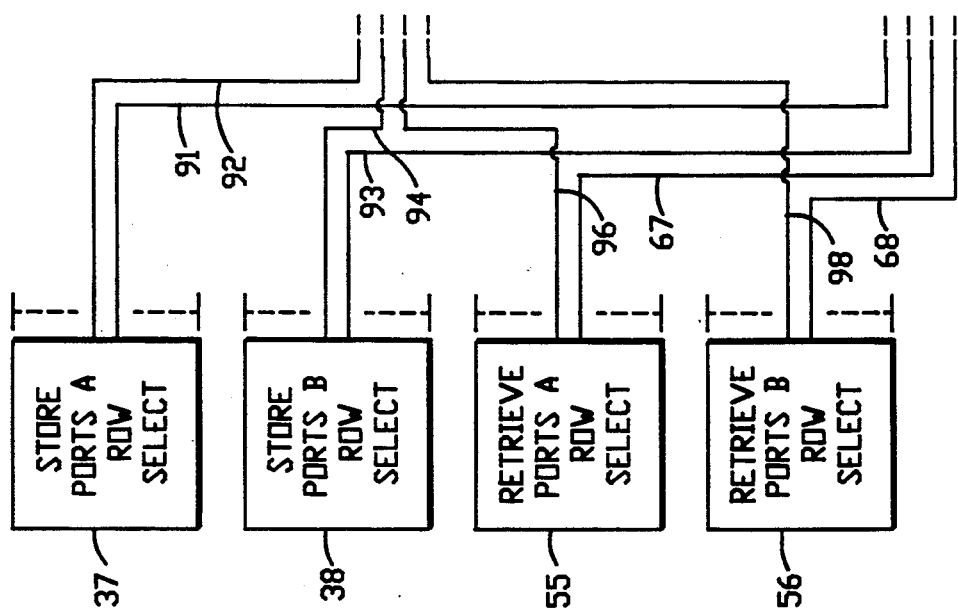
Figure 2:
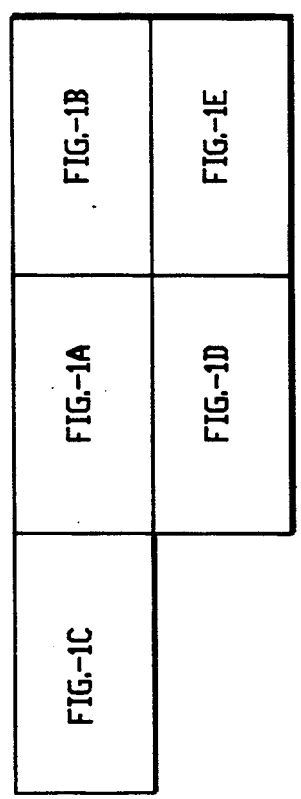
FIG. 2 shows the interconnection arrangement of the circuits of FIGS. 1A through 1E.

FIGS. 1A through 1E show a mixed block and circuit schematic diagram of portions of a memory system in which each memory cell has both a pair of storage ports and a pair of retrieval ports associated therewith. The connections of these ports for four such memory cells to the various control and data transfer portions of the system are shown. The memory cells shown are those at the intersections of two adjacent rows and two adjacent columns in the array of memory cells contained in the memory system.

Two memory cells, 10 and 11, in a single column and in adjacent rows of the memory cell array are shown in FIG. 1A. Similarly, two memory cells, 12 and 13, are shown in a single column of the memory cell array in FIG. 1B with memory cell 10 being in the same row of the memory cell array as is cell 12, and with memory cell 11 being in the same row as cell 13.

Each of these memory cells has a bistable circuit of a selected one of the kinds described above but could be implemented with an alternative kind. There is a pair of PNP bipolar transistors, 14 and 15, in each cell serving as loads for a pair of cross-coupled NPN bipolar transistors, 16 and 17, serving in each cell as control transistors for that cell.

The collector of NPN bipolar transistor 16 is connected to the base of PNP bipolar transistor 14 as its load, and also to the base of transistor 17 in the cross coupling arrangement. A collector of load transistor 14 is connected to the base of transistor 16. A second collector of transistor 14 is connected to the base of transistor 14 to reduce the base current therein as described above. Similarly, the collector of control PNP bipolar transistor 17 is connected to the base of load PNP bipolar transistor 15 serving as the load for transistor 17, and to the base of transistor 16 in the crosscoupling arrangement. A collector of load transistor 15 is connected to the base of control transistor 17. Another collector of load transistor 15 is connected to its base to reduce base current therethrough, again as described above.

The emitters of load transistors 14 and 15 are joined to one another in each cell, and a relatively positive supply voltage is to be provided to these joined emitters in each cell from a corresponding power supply interconnection line, 18, through a corresponding diode, 19, such a diode also being provided in each cell. In such situations, such a diode reduces the number of diodes needed. Interconnections 18 are common to the anodes of diodes 19 in each instance and extend to a terminal (not shown) adapted for connection to a relatively positive voltage. In a typical emitter-coupled logic gate system which might be used with the memory of FIGS. 1A through 1E, the voltage available for interconnections 18 would typically be zero volts, i.e. the ground reference voltage. Diodes 19 are used to reduce the voltage in each memory cell to improve operation of the cell with the retrieval port and the sense amplifier used in retrieving data therefrom, as will be described below.

The emitters of each control NPN bipolar transistor 16 and 17 in each of the memory cells are also joined together, and connected to a corresponding interconnection line, 20, through a corresponding resistor, 21, with each cell having such a resistor. Interconnections 20 each extend to a corresponding column current sink, 22, shown in FIGS. 1D and 1E, each of which can be any convenient kind of current sink circuit. Such current sink circuits, at the connection opposite that to the memory cells, are typically connected to a terminal (not shown) adapted for connection to a relatively negative voltage which again could well be of a value typical of that used in emitter-coupled logic gate systems. Such a voltage value might be $-4.5$ V. Further current column sinks for other columns of memory cells are indicated in FIGS. 1D and 1E by dashed lines on the outer sides of the two shown although current could be sunk from the cells in arrangements other than the columnar one shown.

The current values provided by column current sinks 22 would typically be set at a value equal to 5% to 10T of the current drawn through a memory cell during a data retrieval operation. Resistors 20 are present to modify the effective impedance characteristic from the bases of control transistors 16 and 17 to the current sinks 22 to thereby reduce the cell sensitivity to noise during the retrieval of data from the cell as will be described below.

Each of memory cells 10, 11, 12 and 13 have a corresponding first storage port circuit, and a second storage port circuit, shown to the left thereof in FIGS. 1A and 1B. That is, memory cell 10 has first storage port circuit, 23, and second storage port circuit, 24. In the same manner, memory cell 11 has a first storage port circuit, 25, and a second storage port circuit, 26. In FIG. 1B, memory cell 12 has a first storage port circuit, 27, and a second storage port circuit, 28. Similarly, memory cell 13 has a first storage port circuit, 29, and a second storage port circuit, 30.

Each of these storage port circuits has a pair of emitter connected NPN bipolar transistors, 31 and 32. The collector of transistor 31 is connected to the base of memory cell control transistor 16, and also to the collector of memory cell control transistor 17. The collector of transistor 32 is similarly connected to the collector of memory cell control transistor 16 and to the base of memory cell control transistor 17.

The emitters of transistors 31 and 32 in each of the storage port circuits are connected to the collector of a corresponding NPN bipolar switching transistor, 33, in the first storage port circuits and to a corresponding NPN bipolar switching circuit, 34, in the second storage port circuits. Transistors 33 and 34 are used to select the particular storage port circuit in which they are located for purposes of placing data into the corresponding memory cell by setting the logic state of the cell, i.e. the voltages on the collectors of control transistors 16 and 17 therein, as an indication of the binary value of the data bit stored in that memory cell.

The emitters 87 of transistors 33 in each of the odd-numbered first storage port circuits, or the "A" storage ports, are connected along line 86 to the Store Ports A Column Select control block, 35, in FIG. 1D through corresponding column interconnections 86. Connections from A storage ports for other memory cells in the array thereof in the memory system not shown are indicated by dashed lines adjacent block 35. The decoding circuitry in block 35 then selects on the basis of addresses received from the digital system using the memory which of the columns of odd-numbered first storage port circuits, or A storage ports, will be selected for a subsequent storage or retrieval operation. The selection is completed by connecting a current sink to the column interconnection selected and, on a pulsed basis, drawing current through that interconnection. The need for a pulsed current flow will be described below.

Similarly, the emitters of transistors 34 in the even-numbered second storage port circuits, which will be termed here as the "B" storage ports, are connected to the Store Ports B Column Select control block, 36, of FIG. 1D through corresponding column interconnections 89. The decoding circuitry in block 36 again receives addresses from the digital system involved for selecting which of the columns of even-numbered second storage port circuits, or B storage ports, are to be chosen for the next data storage or retrieval operation by the connecting of a current sink thereto.

Figure 1D:
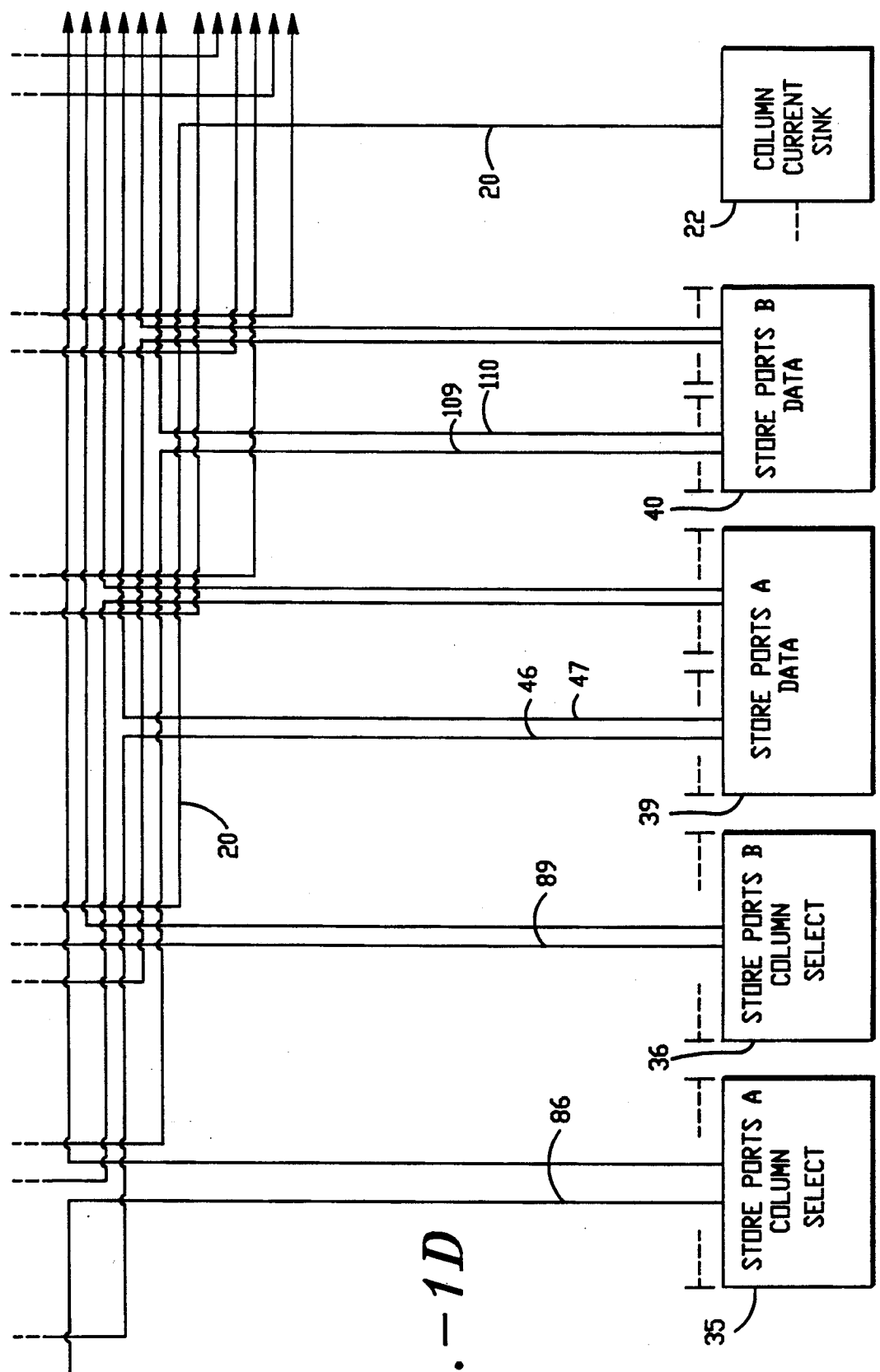
Figure 1E:
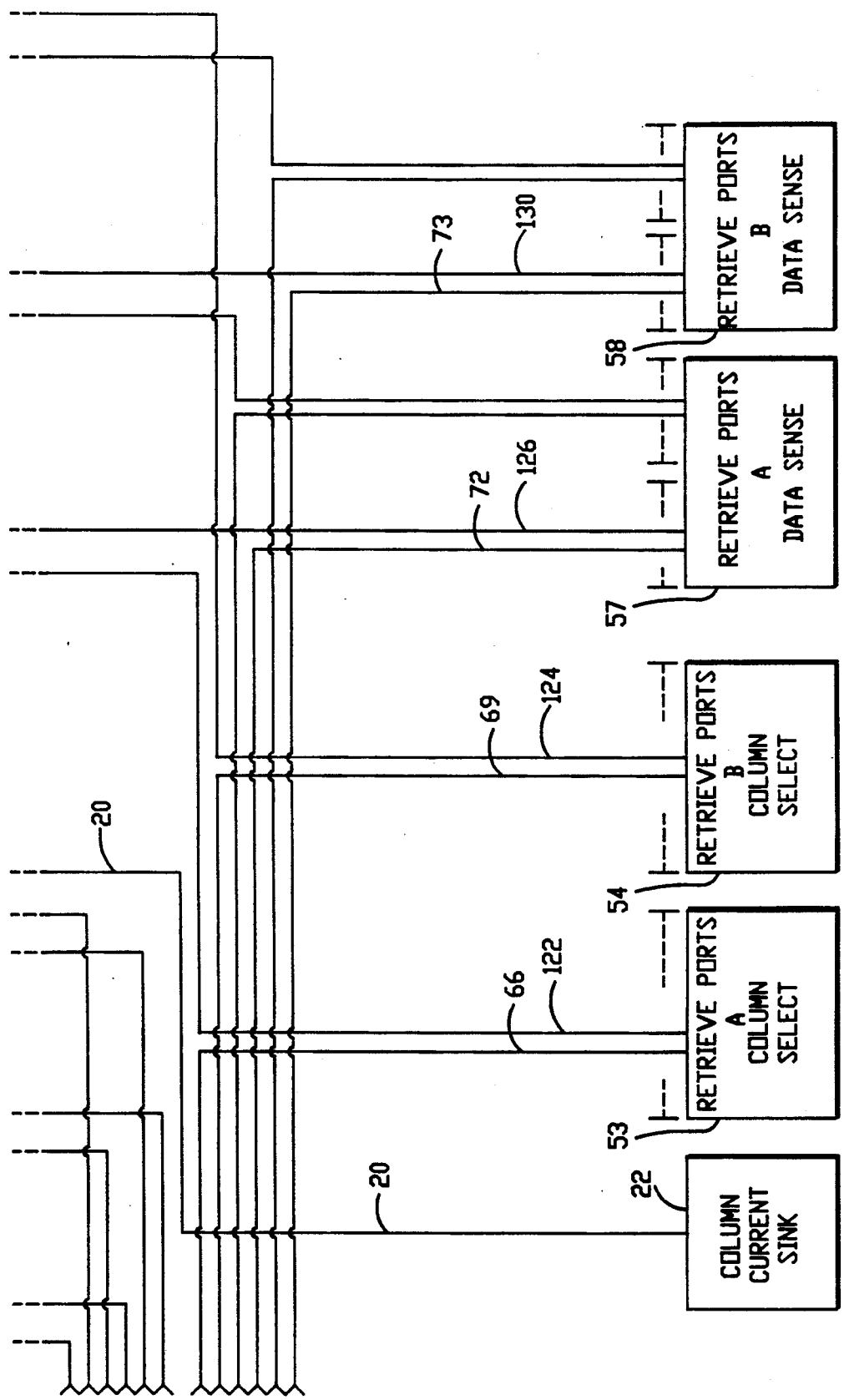

The bases of transistors 33 of the A storage ports are connected to a Store Ports A Row Select control block, 37, shown in FIG. 1C through corresponding row interconnections 92. The decoding circuitry of control block 37 accepts an address from the involved digital system and selects which row of A storage ports are to be selected for the next data storage or retrieval operation. This is done by providing a relatively high voltage to that interconnection.

Thus, a column selection by control block 35 and a row selection by control block 37 electrically energizes the base and the emitter of that switching transistor 33 in the A storage port at the intersection of the selected column and the selected row so that current can pass therethrough and through the emitters of the associated ones of transistors 31 and 32 in that port. Thus, voltage values established on the bases of transistors 31 and 32 can be used to draw current at a collector thereof to in turn set the voltage states at the collectors of control transistors 16 and 17 of the associated memory cell.

Similarly, the bases of transistors 34 in the B storage ports are connected to the Store Ports B Row Select control block, 38, of FIG. 1C by corresponding row interconnections 94. Once again, control block 38, in response to an address provided thereto selects which of the rows of B storage ports are to be selected for the next data storage or retrieval operation. Selection of a row is achieved by providing a relatively high voltage thereto.

Simultaneous selections made by control blocks 36 and 38 electrically energize the emitter and base of a particular one of transistors 34 in the storage port at the intersection of the selected column and row such that current can pass therethrough and through the emitters of the corresponding ones of transistors 31 and 32 in that storage port. This permits drawing current at a collector of these transistors to set the voltage states at the collectors of transistors 16 and 17 of the corresponding memory cell.

Thus, one of the A storage ports and one of the B storage ports can be selected simultaneously to establish a new set of voltage states at the collectors of the control transistors of corresponding ones of the memory cells to which each is connected. Hence, a pair of data storage operations can be performed simultaneously in these corresponding ones of the memory cells in the array thereof provided in the memory system of FIGS. 1A through 1E. The digital system using this memory system must be operated so as to avoid attempting the simultaneous storage of information in the same memory cell from both the A storage port and the B storage port connected thereto.

The decoding circuitry for each of control boxes 35 through 38 can be generally based in a well known manner on multiple-emitter NPN bipolar transistors having these emitters connected to storage address buffer registers which receive the storage address information from the remainder of the digital system using the memory. The bases of the multi-emitter transistors are connected to a voltage supply, and the corresponding collector is connected to that supply through a resistor. The collectors are also connected to the base of corresponding emitter-follower transistors having a current sink as a load serving as the decoder output device, there being one such decoder arrangement connected to each row interconnection line. Slight variations of this decoder configuration are used in some of the various decoders of the memory system to adjust voltage levels, operating times and the like. Each of the column interconnections is also provided with one such decoding device, but rather than its output being connected to the column interconnections directly as for the row interconnections, the column decoding device output switches a current sink among the column interconnections. The selected column has this current sink connected thereto as indicated above.

A small signal of only about 250 mV is needed at the base of the emitter-follower output transistor in the decoding circuitry to operate the corresponding ones of switching transistors 33 and 34. Such a voltage change, applied to the base-emitter junction of these switching transistors, will provide a sufficiently changed collector current drawn therethrough to permit transistors 31 and 32 to set the voltage states at the collectors of the control transistors in the corresponding memory cells along lines 8 and 9.

The bases of transistors 31 in the A storage ports are connected by one set of column differential signal interconnections 46 to the left side of the Store Ports A Data block, 39, shown in FIG. 1D. The bases of transistors 32 of the A storage ports are connected by another set of column differential signal interconnections 47 to the right side of control block 39. Control block 39 provides complementary logic signals to the bases of transistors 31 and 32 in each of the A storage ports in a column that is selected by the decoding circuitry in block 39.

The control signal current supplied by block 35 to a column of A storage ports is supplied on a pulsed basis. This allows the proper data to be applied to the intended A storage port before this control signal has effectively occurred to select that port. This avoids the chance of an erroneous logic state being written into the port at a time when a relatively large current is being drawn through the memory cell by that port. An erroneous state established when such a current is drawn would require significant discharge current to discharge the cell capacitance thus slowing storage operations significantly. The column selecting control signal current pulse must occur after the row select signal has occurred to select the desired storage port. This is to avoid the possibility of storing data in an incorrect memory cell. Because of this need of a pulsed operation, the decoders in block 35 to be operated on a pulsed signal basis may be separated from those in block 39 even though selecting the same column. The same pulsed operation can also be established using a common set of decoders operating through other control circuits.

In an identical manner, the bases of transistors 31 in the B storage ports are connected by column differential signal interconnections 109 to the left side of the Store Ports B Data control block, 40, shown in FIG. 1D. The bases of transistors 32 in those B storage ports are connected by column differential interconnections 110 to the right side of control block 40. Control block 40 provides complementary logic signals to the bases of these transistors 31 and 32 in that column of B storage ports selected by the decoding circuitry in control block 40. Again, the control signals from block 36 are applied to the emitters of transistors 34 of the selected column of B storage ports on a pulsed basis to again assure only correct data are written in the intended memory cell through the selected B storage port.

The differential signal supplied by blocks 39 and 40 need to have a voltage change of only 250 mV each. Such a difference is sufficient to cause transistors 31 and 32 in a storage port circuit to provide an adequate difference in current drawn from the two sides of the corresponding memory cell through transistors 31 and 32 to establish the desired voltage states at the collectors of control transistors 16 and 17 of the corresponding memory cell. Thus, all of the switching signals for selection of an A storage port or a B storage port, and all of the signals for supplying complementary signals thereto as data, are relatively small voltage change signals. This means that only small changes in the voltages across the distributed capacitances along the interconnections need to be charged or discharged. Further, since the interconnection lines all go to the base of a subsequent transistor (including the column select decoders which operate the base of transistor switches to switch the current sink to the selected column line), there are relatively small currents drawn and the interconnection lines can be small structures having relatively little capacitance. These measures all contribute significantly to increasing the switching speed at which the memory system of FIGS. 1A through 1E can operate.

Further, since the bulk of the current drawn through the memory cell in a data storage operation is drawn by the corresponding storage port circuit which is causing the storage operation to occur, the current through the memory cell in the absence of a storage operation occurring therein can be quite small relative to the current drawn through the cell for a data storage operation or, as will be seen below, a data retrieval operation. Thus, the transistors in the memory cell, particularly the PNP load transistors, do not carry significant currents leading to a large diffusion capacitance occurring which must be discharged to switch the memory cell. Hence, the memory cell also can switch considerably more quickly so that the operation of the memory system in providing data storage operations can be relatively rapid.

Rapidity of operation is achieved in the circuit of FIGS. 1A through 1E. At the same time, simultaneous storage operations in two different memory cells are possible. As indicated above, an A storage port circuit can have a data storage operation performed in connection with it while another operation can be performed with a B storage port circuit.

There is also associated with each of the memory cells in the array thereof in the memory system, including memory cells 10 through 13, a pair of data retrieval port circuits. Memory cell 10 has a first retrieval port circuit, 41, and a second retrieval port circuit, 42, shown connected to it in FIG. 1A. Memory cell 11 has a first retrieval port circuit, 43, and a second retrieval port circuit, 44, connected to it in FIG. 1A. Similarly, memory cell 12 has a first retrieval port circuit, 45, and a second retrieval port circuit, 46, connected thereto in FIG. 1B. Finally, memory cell 13 has a first retrieval port circuit, 47, and a second retrieval port circuit, 48, connected to it in FIG. 1B.

Each of these retrieval port circuits have a pair of emitter-coupled NPN bipolar transistors, 49 and 40, provided therein. The base of each transistor 49 is connected to the base of NPN bipolar control transistor 17 in its associated memory cell, and therefore to the collector of NPN bipolar control transistor 16. Similarly, the base of each of transistors 50 is connected to the collector of NPN bipolar transistor 17 in the associated memory cell, and so to the base of NPN bipolar transistor 16 in that cell. The emitters of transistors 49 and 50 are each connected to the collector of a NPN bipolar switching transistor, 51, in the odd-numbered first retrieval port circuits and to the collector of a NPN bipolar switching transistor, 52, in even-numbered second retrieval port circuits.

Switching transistors 51 in the odd-numbered first retrieval port circuits, or the "A" retrieval ports, and switching transistors 52 in the even-numbered second retrieval port circuits, or the "B" retrieval ports, are operated essentially in the same manner as the corresponding switching transistors 33 and 34 in the storage port circuits. That is, the emitters of transistors 51 are connected to a series of interconnections 66 serving as column interconnection lines which are brought to a control block, 53, shown in FIG. 1E and designated Retrieve Ports A Column Select. Control block 53 has essentially the same kinds of decoders and switched current sinks therein as did control block 35 except the control signal currents need not be pulsed. Similarly, the emitters of switching transistors 52 for each column of memory cells are connected to a column interconnection line 69 each of which is brought to a control block, 54, also shown in FIG. 1E and designated Retrieve Ports B Column Select. The decoders and switch current sinks of control block 54 are essentially the same as those provided in control block 36 except, again, the control signal currents need not be pulsed.

The bases of switching transistors 51 in the A ports are connected to a corresponding row interconnection for each row of memory cells with these row interconnections 96 being brought to a control block, 55, shown in FIG. 1C and designated Retrieve Ports A Row Select in that figure. The bases of transistors 52 in the B ports are connected to a row interconnection line 98 for each of those ports associated with a row of memory cells, and these interconnection lines are brought to a further control block, 56, designated Retrieve Ports B Row Select also shown in FIG. 1C. Once again, the decoders in control blocks 55 and 56 for the row of retrieval port circuits are essentially like those provided in control blocks 37 and 38 used in connection with the rows of storage port circuits.

Hence, the designation of a column of A ports or B ports and the designation of a row of A ports or B ports selects a particular retrieval port circuit from among those forming the A ports and the B ports. Thus, simultaneous data retrievals can be made from an A port and a B port by the selection of one of each during the same memory system operation cycle for either retrieving information, or for both storing and retrieving information.

Retrieval ports A and B differentially sense the voltage difference between the collectors of control transistors 16 and 17 in the memory cells to which they are connected. This differential sensing is provided by transistors 49 and 50 each having its base connected to one side of the corresponding memory cell. The collectors of transistors 49 and 50 in each retrieval port circuit are connected to a pair of data sensing interconnections 72, 73 and 126, 130 provided for each column of A ports and each column of B ports, respectively, associated with a column of memory cells. The data sensing interconnection 72 for the collector of transistors 49 in a column of A ports is brought to one side of a sense amplifier block, 57, designated Retrieve Ports A Data Sense shown in FIG. 1E. The collectors of transistors 50 are also connected to corresponding data sense interconnections 73 for columns of ports A, and these data sense interconnections are brought to the other side of differential sense amplifier block 57. In the same manner, columns of data sense interconnections 126 and 130 from transistors 49 and 50 of columns of B ports are brought to either side of a further sense amplifier block, 58, designated Retrieve Ports B Data Sense also shown in FIG. 1E. Each pair of data sense interconnections 126 and 130 from a column of retrieval ports are brought to a corresponding emitter of one of a pair of NPN bipolar transistors. The bases of each of these transistors is connected to a relatively positive power supply, and the collectors thereof are connected through a resistor to the same supply. One resistor serves for all of the interconnection lines from transistors 49 in all of A ports in block 57, and another resistor serves for the interconnection lines from the collectors of transistors 50 in all of the A ports in block 57. A similar arrangement is provided in block 59 for the B ports, these isolating transistors and signal resistors not being shown as they are well known sensing amplifier circuit portions. Data signals are obtained in each of blocks 57 and 58 differentially across the sensing resistors.

In such an arrangement, diodes 19 are provided to limit the saturation of either transistors 49 or 50 when current is drawn therethrough by the switching into the "on" condition of either transistors 51 or 52 for an A port or B port, respectively. Resistors 21 are provided to reduce the standby current required while still avoiding having a data retrieval operation change the data stored in the memory cell to which it is connected if noise occurs in the cell supplying the data. Thus, operations of the retrieval ports in the memory system does not require the memory cells therein to have much current being drawn therethrough.

The occurrence of noise represented by a significant drop in the voltage at the base of the cell control transistor in the "on" condition, in the absence of resistors 21, would cause a large reduction in the current flowing in a memory cell. In a memory cell selected for a data retrieval, the current drawn through the bases of the retrieval port circuit transistors 49 and 50 could alter the voltage states of the control transistor collectors representing the stored information if such a significant reduction occurred in the current flowing through the memory cell.

The voltage does not change significantly across the memory cells during operation, and selections made in the memory cell do not cause any changes at the emitters of either the PNP load transistors or the NPN control transistors. As a result, there is no large charging and discharging of capacitances associated with interconnections involved directly with the memory cells. In addition, the kind of sense amplifier indicated above requires no voltage change along the interconnections between the A and B retrieval port circuits and sense amplifier blocks 57 and 58 respectively. Thus, data retrievals will tend to be rapid in this memory system shown in FIGS. 1A through 1E.

Achieving the sufficient densities of circuits for the memory system in a monolithic integrated circuit requires merging of as many device structures used in implementing the memory circuit as possible. Such merging is well known for the memory cell bistable circuit devices where lateral PNP load transistors are used. The storage port circuits and the retrieval port circuits can in some situations be advantageously merged in part with the corresponding memory cell circuits and, in other situations, can be advantageously merged with each other. For instance, the storage ports in multiple port situations could be merged with the corresponding memory cell, or those associated with one cell could be merged with each other. Retrieval ports in the same column could be merged with each other.

Although the present invention has been described with reference to preferred embodiments, workers skilled in the art will recognize that changes may be made in form and detail without departing from the spirit and scope of the invention.

What is claimed is:

1. A memory circuit having memory cells for storing information through corresponding storage ports, said memory circuit comprising:
    a first memory cell circuit having four transistors of both PNP and NPN type comprising:
    a pair of load bipolar transistors of one of said types, each having an emitter electrically connected to a first terminal means and
    a pair of control bipolar transistors of the other of said types, each having a collector electrically connected to a base of a corresponding one of said pair of load bipolar transistors and each having a base electrically connected to a collector of the corresponding one of said pair of load bipolar transistors, each control bipolar transistor having its base electrically connected to the collector of the other control bipolar transistor in said first memory cell circuit and its emitter electrically connected to a second terminal means and
    a first memory cell initial storage port circuit having a row select input, a column select input, a pair of signal inputs, and a pair of signal outputs with each of said signal outputs being electrically connected to a collector of a corresponding one of said pair of control bipolar transistors in said first memory cell circuit, said first memory cell initial storage port circuit having a pair of bipolar transistors providing a pair of complementary output signals on said pair of signal outputs of the port circuit, representing a pair of complementary signals provided on said pair of signal inputs if a row select signal is present on said row select input simultaneously with a column select signal being present on said column select input.

2. The apparatus of claim 1 wherein the emitter of said pair of load bipolar transistors in said first memory cell circuit are electrically connected to said first terminal means through a diode means.

3. The apparatus of claim 1 wherein the emitters of said pair of control bipolar transistors in said first memory cell circuit are electrically connected to said second terminal means through a resistive means.

4. The apparatus of claim 1 wherein each of said pair of load bipolar transistors in said first memory cell circuit is a pnp bipolar transistor, and each of said pair of control bipolar transistors is a npn bipolar transistor.

5. The apparatus of claim 1 wherein each of said pair of load bipolar transistors in said first memory cell circuit has a second collector connected to its base.

6. The apparatus of claim 1 wherein said memory circuit comprises a plurality of first memory cell storage port circuits, including said first memory cell initial storage port circuit, each having a row select input, a column select input, a pair of signal inputs and a pair of signal outputs with each signal output being electrically connected to a collector of one of said pair of control bipolar transistors in said first memory cell circuit, each of said plurality of first memory cell storage port circuits providing a pair of complementary output signals on its corresponding signal outputs representing a pair of complementary signals provided on its corresponding signal inputs if a corresponding row select signal is present on its row select input simultaneously with a corresponding column select signal being present on its column select input thereof.

7. The apparatus of claim 1 wherein said memory circuit further comprises a first memory cell initial retrieval port circuit having an initial retrieval port row select input, an initial retrieval port column select input, a pair of initial retrieval port signal inputs with each initial retrieval port signal input being electrically connected to a collector of a corresponding one of said pair of control bipolar transistors in said first memory cell circuit, and having a pair of initial retrieval port signal outputs, said first memory cell initial retrieval port circuit providing complementary signals on said pair of initial retrieval port signal outputs which are representative of complementary signals provided on said pair of initial retrieval port signal inputs if a corresponding row select input simultaneously with a corresponding column select signal being present on said initial retrieval port column select input.

8. The apparatus of claim 7 wherein the emitters of said pair of load bipolar transistors in said first memory cell circuit are each electrically connected to said first terminal means through a diode means.

9. The apparatus of claim 7 wherein the emitters of said pair of control bipolar transistors in said first memory cell circuit are electrically connected to said second terminal means through a resistive means.

10. The apparatus of claim 7 wherein said first memory cell initial retrieval port circuit comprises a pair of symmetrically connected signal bipolar transistors having their respective emitters electrically connected together, and a switching bipolar transistor having its collector connected to the emitters of said pair of signal bipolar transistors, each signal bipolar transistor having a collector serving as one of said pair of signal outputs of said first memory cell initial retrieval port circuit and having a base serving as one of said pair of signal inputs of said first memory cell initial retrieval port circuit, said switching transistor having a base and an emitter serving as said first memory cell initial retrieval port circuit row select and column select inputs, respectively.

11. The apparatus of claim 7 wherein said memory circuit comprises a plurality of first memory cell retrieval port circuits, including said first memory cell initial retrieval port circuit, each having an initial retrieval port row select input, an initial retrieval port column select input, a pair of initial retrieval signal inputs and a pair of initial retrieval port signal outputs with each initial retrieval port signal input being electrically connected to a collector of a corresponding one of said pair of control bipolar transistors in said first memory cell circuit, each of said plurality of first memory cell retrieval port circuits providing a pair of complementary output signals on initial retrieval port signal outputs representing a pair of complementary signals provided on its corresponding pair of initial retrieval port signal inputs if a corresponding row select signal is present on its initial retrieval port row select input simultaneously with a corresponding column select signal being present on its initial retrieval port column select input.

12. The apparatus of claim 1 wherein said memory circuit further comprises a second memory cell circuit having a pair of second memory cell load bipolar transistors of one of said types, each having an emitter electrically connected to said first terminal means, and a pair of second memory cell control bipolar transistors of the other of said types, each having a collector electrically connected to a base of a corresponding one of said pair of second memory cell load bipolar transistors in the second memory cell circuit and a base electrically connected to a collector of the corresponding one of said pair of load bipolar transistors in the second memory cell circuit, each control bipolar transistor in the second memory cell circuit having its base electrically connected to the collector of the other control bipolar transistor in the second memory cell circuit and its emitter electrically connected to a selected terminal means.

13. The apparatus of claim 12 wherein said memory circuit further comprises a second memory cell initial storage port circuit having a row select input, a column select input, a pair of signal inputs, and a pair of signal outputs with each signal output being electrically connected to a collector of a corresponding one of said pair of control bipolar transistors in said second memory cell circuit, said second memory cell initial storage port circuit providing a pair of complementary output signals on its corresponding pair of signal outputs, representing a pair of complementary signals provided on its corresponding pair of signal inputs if a corresponding row select signal is present on its row select input simultaneously with a column select signal being present on its input.

14. The apparatus of claim 13 wherein said first memory cell initial storage port circuit row select input is electrically connected in common with said second memory cell initial storage port circuit row select input.

15. The apparatus of claim 13 wherein said first memory cell initial storage port circuit column select input is electrically connected in common with said second memory cell initial storage port circuit column select input.

16. The apparatus of claim 13 wherein said second memory cell initial storage port circuit comprises a pair of symmetrically arranged signal bipolar transistors having their respective emitters electrically connected together, and a switching bipolar transistor having its collector connected to the emitters of said pair of signal bipolar transistors, each signal bipolar transistor having a collector serving as one of said pair of signal outputs of said second memory cell initial storage port circuit and having a base serving as said pair of signal inputs of said second memory cell initial storage port circuit, said switching transistor having a base and an emitter serving as said first memory cell initial storage port circuit row select and column select inputs, respectively.

17. The apparatus of claim 16 wherein said first memory cell initial storage port circuit comprises a pair of signal bipolar transistors, having their respective emitters electrically connected together, and a switching bipolar transistor having its collector connected to the emitters of said pair of signal bipolar transistors of said first memory cell circuit, each signal bipolar transistor of said first memory cell circuit having a collector serving as one of said pair of signal outputs of said first memory cell initial storage port circuit and having a base serving as said pair of signal inputs of said first memory cell initial storage port circuit, said switching transistor of said first memory cell circuit having a base and an emitter serving as said first memory cell initial storage port circuit row select and column select inputs, respectively.

18. The apparatus of claim 13, wherein said memory circuit further comprises a first memory cell initial retrieval port circuit having an initial retrieval port row select input, an initial retrieval port column select input, a pair of initial retrieval port signal inputs with each initial retrieval port signal input being electrically connected to a collector of a corresponding one of said pair of control bipolar transistors in said first memory cell circuit, and having a pair of initial retrieval port signal outputs, said first memory cell initial retrieval port circuit providing complementary signals on said pair of initial retrieval port signal outputs which are representative of complementary signals provided on said pair of initial retrieval port signal inputs if a corresponding row select signal is present on said initial retrieval port row select input simultaneously with a corresponding column select signal being present on said initial retrieval port column select input.

19. The apparatus of claim 18 wherein said memory circuit further comprises a second memory cell initial retrieval port circuit having a secondary memory cell initial retrieval port row select input, a second memory cell initial retrieval port column select input, a pair of second memory cell initial retrieval port signal inputs with each of said pair of second memory cell initial retrieval port signal inputs of said second memory cell initial retrieval port circuit being electrically connected to a collector of a corresponding one of said pair of control bipolar transistors in said second memory cell circuit, and having a pair of second memory cell initial retrieval port signal outputs, said second memory cell initial retrieval port circuit providing complementary signals on its corresponding pair of second memory cell initial retrieval port signal outputs which are representative of complementary signals provided on its corresponding pair of second memory cell initial retrieval port signal inputs if a corresponding row select signal is present on its second memory cell initial retrieval port row select input simultaneously with a corresponding column select signal being present on its second memory cell initial retrieval port column select input.

20. The apparatus of claim 19 wherein said first memory cell initial storage port circuit row select input is electrically connected in common with said second memory cell initial storage port circuit row select input, and wherein said first memory cell initial retrieval port circuit row select input is electrically connected in common with said second memory cell initial retrieval port circuit row select input.

21. The apparatus of claim 19 wherein said first memory cell initial storage port circuit column select input is electrically connected in common with said second memory cell initial storage port circuit column select input, and wherein said first memory cell initial retrieval port circuit column select input is electrically connected in common with said second memory cell initial retrieval port circuit column select input.

22. The apparatus of claim 13 wherein said memory circuit comprises a plurality of first memory cell storage port circuits, including said first memory cell initial storage port circuit, each having a row select input, a column select input, a pair of signal inputs and a pair of signal outputs with each signal output being electrically connected to a collector of one of said pair of control bipolar transistors in said first memory cell circuit, each of said plurality of first memory cell storage port circuits providing a pair of complementary output signals on its corresponding signal outputs representing a pair of complementary signals provided on its corresponding signal inputs if a corresponding row select signal is present on its row select input simultaneously with a corresponding column select signal being present on its column select input thereof.

23. The apparatus of claim 22 wherein said memory circuit comprises a plurality of second memory cell storage port circuits, including said second memory cell initial storage port circuit, each having a row select input, a column select input, a pair of signal inputs and a pair of signal outputs with each signal output being electrically connected to a collector of one of said pair of control bipolar transistors in said second memory cell circuit, each of said plurality of second memory cell storage port circuits providing a pair of complementary output signals on its corresponding signal outputs representing a pair of complementary signals provided on its corresponding signal inputs if a corresponding row select signal is present on its row select input simultaneously with a corresponding column select signal being present on its column select input thereof.

24. The apparatus of claim 23 wherein said memory circuit further comprises a first memory cell initial retrieval port circuit having an initial retrieval port row select input, an initial retrieval port column select input, a pair of initial retrieval port signal inputs with each of said pair of initial retrieval port signal inputs of said first memory cell initial retrieval port circuit being electrically connected to a collector of a corresponding one of said pair of control bipolar transistors in said first memory cell circuit, and having a pair of initial retrieval port signal outputs, said first memory cell initial retrieval port circuit providing complementary signals on its corresponding pair of initial retrieval port signal outputs which are representative of complementary signals provided on its corresponding pair of initial retrieval port signal inputs if a corresponding row select signal is present on its initial retrieval port row select input simultaneously with a corresponding column select signal being present on its initial retrieval port column select input.

25. The apparatus of claim 24 wherein said memory circuit further comprises a second memory cell initial retrieval port circuit having a row select input, a column select input, a pair of signal inputs with each of said pair of signal inputs being electrically connected to a said collector of one of said pair of control bipolar transistors in said second memory cell circuit, and having a pair of signal outputs, said second memory cell initial retrieval port circuit being capable of providing complementary signals on said pair of signal outputs thereof which are representative of complementary signals provided on said pair of signal inputs thereof if said pair of signal outputs are each connected to selected loads and if a corresponding row select signal is present on said row select input thereof simultaneously with a corresponding column select signal being present on said column select input thereof.

26. The apparatus of claim 25 wherein said memory circuit comprises a plurality of first memory cell retrieval port circuits, including said first memory cell initial retrieval port circuit, each having an initial retrieval port row select input, an initial retrieval port column select input, a pair of initial retrieval port signal inputs and a pair of signal outputs with each initial retrieval port signal input being electrically connected to a collector of a corresponding one of said pair of control bipolar transistors in said first memory cell circuit, each of said plurality of first memory cell retrieval port circuits providing a pair of complementary output signals on its corresponding pair of initial retrieval port signal outputs representing a pair of complementary signals provided on its corresponding pair of initial retrieval port signal inputs if a corresponding row select signal is present on its initial retrieval port row select input simultaneously with a corresponding column select signal being present on its initial retrieval port column select input.

27. The apparatus of claim 26 wherein said memory circuit comprises a plurality of second memory cell retrieval port circuits, including said second memory cell initial retrieval port circuit, each having an initial retrieval port row select input, an initial retrieval port column select input, a pair of initial retrieval port signal inputs and a pair of initial retrieval port signal outputs with each initial retrieval port signal input being electrically connected to a collector of a corresponding one of said pair of control bipolar transistors in said second memory cell circuit, each of said plurality of second memory cell retrieval port circuits providing a pair of complementary output signals on its corresponding pair of initial retrieval port signal outputs representing a pair of complementary signals provided on its corresponding pair of initial retrieval port signal inputs if a corresponding row select signal is present on its initial retrieval port row select input simultaneously with a corresponding column select signal being present on its initial retrieval port column select input.

28. The apparatus of claim 27 wherein said first memory cell initial storage port circuit row select input is electrically connected in common with said second memory cell initial storage port circuit row select input, and wherein said first memory cell initial retrieval port circuit row select input is electrically connected in common with said second memory cell initial retrieval port circuit row select input.

29. The apparatus of claim 27 wherein said first memory cell initial storage port circuit column select input is electrically connected in common with said second memory cell initial storage port circuit column select input, and wherein said first memory cell initial retrieval port circuit column select input is electrically connected in common with said second memory cell initial retrieval port circuit column select input.

* * * * *